United States Patent
Obata

(10) Patent No.: US 10,511,259 B2
(45) Date of Patent: Dec. 17, 2019

(54) OSCILLATOR, ELECTRONIC APPARATUS, AND VEHICLE

(71) Applicant: SEIKO EPSON CORPORATION, Tokyo (JP)

(72) Inventor: Naohisa Obata, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 21 days.

(21) Appl. No.: 15/919,701

(22) Filed: Mar. 13, 2018

(65) Prior Publication Data

US 2018/0269832 A1    Sep. 20, 2018

(30) Foreign Application Priority Data

Mar. 17, 2017   (JP) ................. 2017-052712

(51) Int. Cl.
| | |
|---|---|
| H03B 5/32 | (2006.01) |
| H03B 5/04 | (2006.01) |
| H01L 41/053 | (2006.01) |
| H03L 1/02 | (2006.01) |
| H01L 41/23 | (2013.01) |
| H01L 41/047 | (2006.01) |

(Continued)

(52) U.S. Cl.
CPC .............. *H03B 5/04* (2013.01); *H01L 41/053* (2013.01); *H01L 41/23* (2013.01); *H03B 5/32* (2013.01); *H03L 1/028* (2013.01); *H01L 24/32* (2013.01); *H01L 24/48* (2013.01); *H01L 24/73* (2013.01); *H01L 41/047* (2013.01); *H01L 41/107* (2013.01); *H01L 2224/32225* (2013.01); *H01L 2224/48091* (2013.01); *H01L 2224/48108* (2013.01); *H01L 2224/73265* (2013.01); *H01L 2924/1461* (2013.01)

(58) Field of Classification Search
CPC ......... H01L 41/053; H01L 41/23; H03B 5/04; H03B 5/30; H03B 5/32; H03B 5/36; H03H 9/02102; H03H 9/0547; H03L 1/00; H03L 1/02; H03L 1/026; H03L 1/028; H03L 1/04
USPC ............... 331/68–70, 154, 156, 158, 176
See application file for complete search history.

(56) References Cited

U.S. PATENT DOCUMENTS

| | | | | |
|---|---|---|---|---|
| 4,404,459 A | * | 9/1983 | Harton | H03L 1/04 219/209 |
| 10,291,236 B2 | * | 5/2019 | Chiang | H03L 1/02 |

(Continued)

FOREIGN PATENT DOCUMENTS

| | | |
|---|---|---|
| JP | 2014-053663 A | 3/2014 |
| JP | 2014-107862 A | 6/2014 |
| JP | 2016-187152 A | 10/2016 |

*Primary Examiner* — Levi Gannon
(74) *Attorney, Agent, or Firm* — Oliff PLC

(57) ABSTRACT

An oscillator includes a vibration element, an oscillation circuit configured to oscillate the vibration element and output an oscillation signal, a temperature sensor, a temperature compensation circuit configured to compensate for a frequency temperature characteristic of the vibration element based on an output signal of the temperature sensor. The vibration element is within a first case having a first atmosphere, and the oscillation circuit, the temperature sensor, and the first case are within a second case having a second atmosphere, whereby the first atmosphere has a higher thermal conductivity than the second atmosphere.

20 Claims, 9 Drawing Sheets

(51) Int. Cl.
 *H01L 41/107* (2006.01)
 *H01L 23/00* (2006.01)

(56) References Cited

U.S. PATENT DOCUMENTS

| | | | |
|---|---|---|---|
| 2006/0192626 A1* | 8/2006 | Milliren | H03B 5/04 331/158 |
| 2014/0152392 A1 | 6/2014 | Owaki et al. | |
| 2014/0368288 A1* | 12/2014 | Yamada | H03H 9/21 331/156 |
| 2015/0116052 A1* | 4/2015 | Kikushima | H03H 9/0552 331/158 |
| 2015/0180445 A1* | 6/2015 | Isohata | H03H 9/02102 331/70 |
| 2016/0285461 A1* | 9/2016 | Okubo | H03L 1/028 |
| 2016/0285462 A1 | 9/2016 | Takamuku et al. | |
| 2017/0230003 A1* | 8/2017 | Kikuchi | H03B 5/32 |
| 2017/0272082 A1* | 9/2017 | Obata | H03L 1/04 |
| 2017/0272083 A1* | 9/2017 | Owaki | H03B 1/02 |

* cited by examiner

OSCILLATOR, ELECTRONIC APPARATUS, AND VEHICLE

CROSS REFERENCE

The entire disclosure of Japanese Patent Application No. 2017-052712, filed Mar. 17, 2017, is expressly incorporated by reference herein.

BACKGROUND

1. Technical Field

The present invention relates to an oscillator, an electronic apparatus, and a vehicle.

2. Related Art

A Temperature Compensated Crystal Oscillator (TCXO) includes a quartz crystal vibrator and an Integrated Circuit (IC) for oscillating the quartz crystal vibrator, and the IC performs temperature compensation of a deviation (frequency deviation) of an oscillation frequency of the quartz crystal vibrator from a desired frequency (nominal frequency) in a predetermined temperature range, thereby obtaining high frequency accuracy. Such a temperature compensated crystal oscillator (TCXO) is disclosed in, for example, JP-A-2016-187152. In the TCXO disclosed in JP-A-2016-187152, an integrated circuit is configured to include a temperature compensation circuit that compensates for a frequency temperature characteristic of a vibration element on the basis of an output signal of a temperature sensor.

The temperature compensated crystal oscillator has high frequency stability, and thus is used in communication apparatuses requiring high performance and high reliability, and the like.

The above-described oscillator is supposed to be disposed under various temperature environments and is required to have high frequency stability even under a severe temperature environment.

For example, in a case where the oscillator receives wind by the operation of a fan or the like, a difference in temperature easily occurs between the integrated circuit and the quartz crystal vibrator. When the difference in temperature occurs between the integrated circuit (temperature sensor) and the quartz crystal vibrator, an error occurs in temperature compensation by the temperature compensation circuit, and thus a desired performance may not be exhibited.

SUMMARY

An advantage of some aspects of the invention is to provide an oscillator that may have high frequency stability. In addition, one of purposes according to some aspects of the invention is to provide an electronic apparatus and a vehicle which include the oscillator.

The invention can be implemented as the following forms or application examples.

Application Example 1

An oscillator according to this application example includes a vibration element, an oscillation circuit that oscillates the vibration element and outputs an oscillation signal, a temperature sensor that detects a temperature, a temperature compensation circuit that compensates for a frequency temperature characteristic of the vibration element on the basis of an output signal of the temperature sensor, a first case that accommodates the vibration element and has a first atmosphere therein, and a second case that accommodates the first case, the oscillation circuit, the temperature sensor, and the temperature compensation circuit and has a second atmosphere therein, in which a thermal conductivity of the first atmosphere is higher than a thermal conductivity of the second atmosphere.

Various oscillation circuits such as a Pierce oscillation circuit, an inverter type oscillation circuit, a Colpitts oscillation circuit, and a Hartley oscillation circuit may be constituted by the vibration element and the oscillation circuit.

In the oscillator according to this application example, since the thermal conductivity of the first atmosphere is higher than the thermal conductivity of the second atmosphere, heat is easily transmitted between the temperature sensor and the vibration element and is hardly transmitted between the outside of the second case, and the temperature sensor and the vibration element which are accommodated in the second case. For this reason, it is possible to reduce a difference in temperature between the temperature sensor and the vibration element. Therefore, in the oscillator according to the application example, an error of temperature compensation by the temperature compensation circuit is decreased as compared with a case where the thermal conductivity of the second atmosphere is equal to or greater than the thermal conductivity of the first atmosphere, and thus the oscillator can have high frequency stability.

Application Example 2

In the oscillator according to the application example, pressure of the first atmosphere may be higher than pressure of the second atmosphere.

In the oscillator according to this application example, since the pressure of the first atmosphere is higher than the pressure of the second atmosphere, heat is easily transmitted between the temperature sensor and the vibration element and is hardly transmitted between the outside of the second case, and the temperature sensor and the vibration element which are accommodated in the second case. For this reason, in the oscillator according to the application example, it is possible to further reduce a difference in temperature between the temperature sensor and the vibration element, and thus the oscillator can have higher frequency stability.

Application Example 3

An oscillator according to this application example includes a vibration element, an oscillation circuit that oscillates the vibration element and outputs an oscillation signal, a temperature sensor that detects a temperature, a temperature compensation circuit that compensates for a frequency temperature characteristic of the vibration element on the basis of an output signal of the temperature sensor, a first case that accommodates the vibration element and has a first atmosphere therein, and a second case that accommodates the first case, the oscillation circuit, the temperature sensor, and the temperature compensation circuit and has a second atmosphere therein, in which pressure of the first atmosphere is higher than pressure of the second atmosphere.

In the oscillator according to this application example, since the pressure of the first atmosphere is higher than the pressure of the second atmosphere, heat is easily transmitted between the temperature sensor and the vibration element and is hardly transmitted between the outside of the second case, and the temperature sensor and the vibration element which are accommodated in the second case. For this reason, it is possible to reduce a difference in temperature between the temperature sensor and the vibration element. Therefore, in the oscillator according to the application example, an error of temperature compensation by the temperature compensation circuit is decreased as compared with a case where the pressure of the second atmosphere is equal to or greater than the pressure of the first atmosphere, and thus the oscillator can have high frequency stability.

Application Example 4

In the oscillator according to the application example, the first case may include a first base including a first surface and a second surface on a side opposite to the first surface, the vibration element may be disposed on the first surface, and the temperature sensor may be disposed on the second surface.

In the oscillator according to this application example, since the vibration element is disposed on the first surface of the first base and the temperature sensor is disposed on the second surface of the first base, and thus it is possible to reduce a difference in temperature between the temperature sensor and the vibration element.

Application Example 5

The oscillator according to the application example may further include a terminal that is disposed on the second surface and is electrically connected to the vibration element, and the oscillation circuit may be disposed on the second surface.

In the oscillator according to this application example, it is possible to reduce the length of a wiring between the oscillation circuit and the vibration element and to reduce the influence of noise.

Application Example 6

In the oscillator according to the application example, the first case may include a first lid which is disposed on a side opposite to the first surface with respect to the vibration element, the second case may include a second base, and the first lid and the second base may be bonded to each other.

In the oscillator according to this application example, the temperature sensor is disposed on the second surface of the first base by bonding the first lid and the second base to each other, and thus it is possible to reduce a difference in temperature between the temperature sensor and the vibration element.

Application Example 7

In the oscillator according to the application example, the first lid and the second base may be bonded to each other by an insulating adhesive.

The insulating adhesive hardly transmits heat as compared to a conductive adhesive. For this reason, in the oscillator according to this application example, it is possible to reduce the influence of a fluctuation in temperature outside the second case on the temperature sensor and the vibration element which are accommodated in the second case. As a result, it is possible to reduce a difference in temperature between the temperature sensor and the vibration element.

Application Example 8

In the oscillator according to the application example, the first atmosphere may include helium.

Helium has a high thermal conductivity. For this reason, in the oscillator according to this application example, heat is easily transmitted between the temperature sensor and the vibration element, and thus it is possible to reduce a difference in temperature between the temperature sensor and the vibration element. Further, helium is an inert gas, and thus it is possible to safely manufacture the oscillator.

Application Example 9

In the oscillator according to the application example, the second atmosphere may be a vacuum.

In the oscillator according to this application example, heat is hardly transmitted between the outside of the second case, and the temperature sensor and the vibration element which are accommodated in the second case, and thus it is possible to reduce a difference in temperature between the temperature sensor and the vibration element.

Application Example 10

In the oscillator according to the application example, pressure of the second atmosphere may be equal to or greater than $1 \times 10^{-3}$ Pa and equal to or less than 10 Pa.

In the oscillator according to this application example, heat is hardly transmitted between the outside of the second case, and the temperature sensor and the vibration element which are accommodated in the second case, and thus it is possible to reduce a difference in temperature between the temperature sensor and the vibration element.

Application Example 11

An electronic apparatus according to this application example includes any one of the oscillators described above.

According to this application example, it is possible to realize the electronic apparatus including the oscillator having high frequency stability.

Application Example 12

A vehicle according to this application example of the invention includes any one of the oscillators described above.

According to this application example, it is possible to realize the vehicle including the oscillator having high frequency stability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred exemplary embodiment of the invention will be described in detail with reference to the accompanying drawings. Meanwhile, this exemplary embodiment described below is not unduly limited to the contents of the invention described in the appended claims. In addition, all configurations described below are not necessarily essential configurational requirements of the invention.

1. Oscillator

1.1. Configuration of Oscillator

Figure 1:
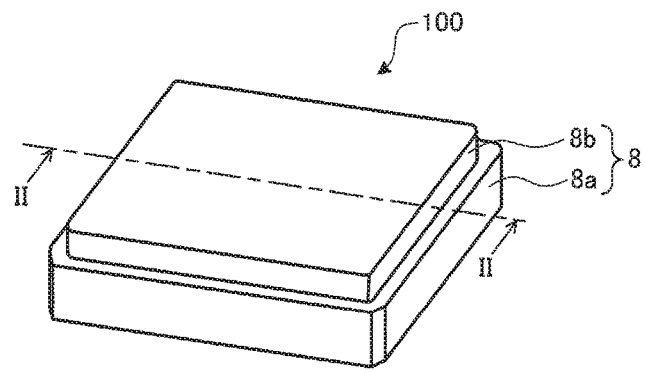
FIG. 1 is a schematic perspective view showing an oscillator according to an exemplary embodiment.
Figure 2:
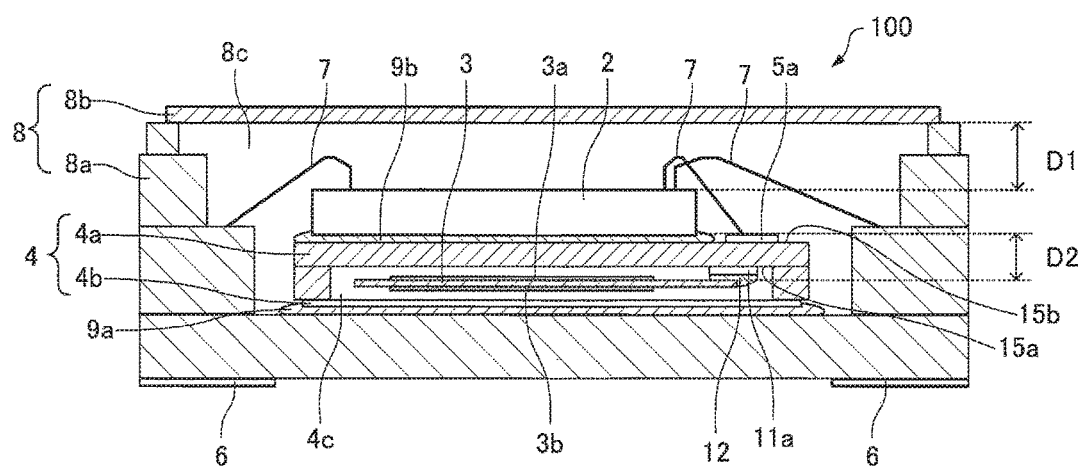
FIG. 2 is a schematic cross-sectional view showing the oscillator according to the exemplary embodiment.
Figure 3:
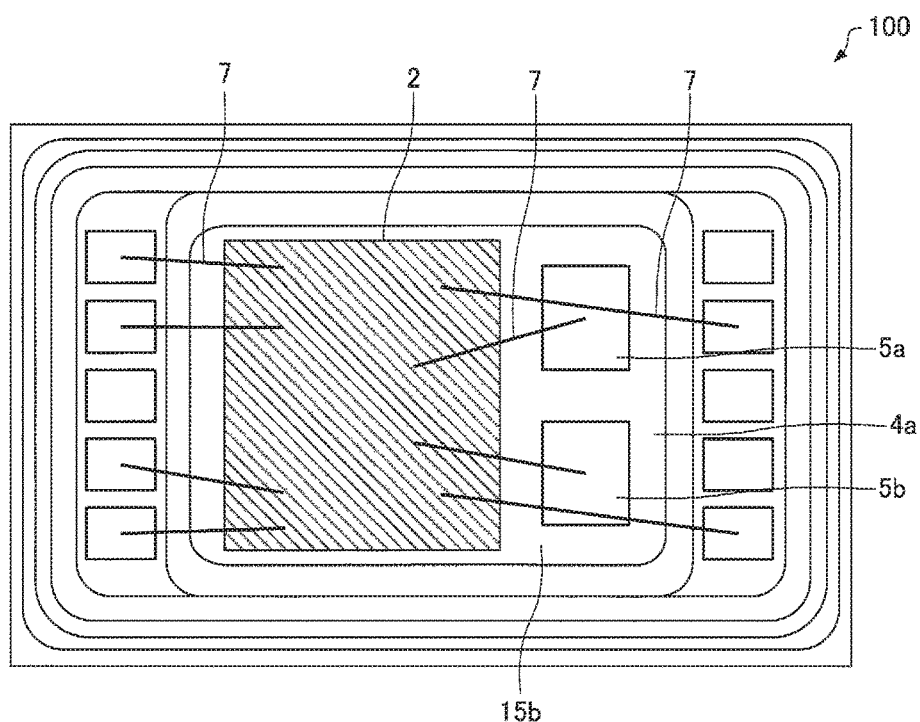
FIG. 3 is a schematic top view showing the oscillator according to the exemplary embodiment.
Figure 4:
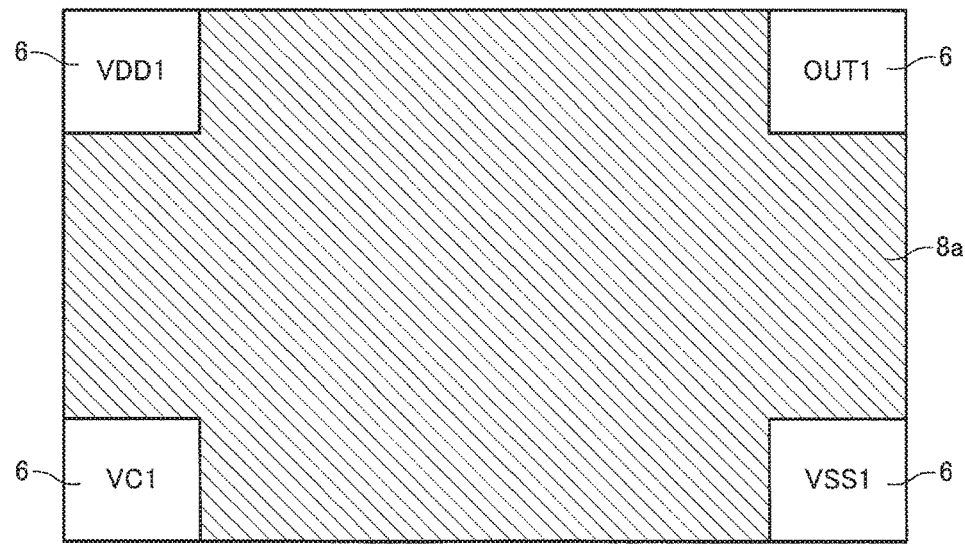
FIG. 4 is a schematic bottom view showing the oscillator according to the exemplary embodiment.

FIGS. 1 to 4 are schematic diagrams showing an example of the structure of an oscillator 100 according to this exemplary embodiment. FIG. 1 is a perspective view of the oscillator 100. FIG. 2 is a cross-sectional view taken along line II-II of FIG. 1. FIG. 3 is a top view of the oscillator 100. FIG. 4 is a bottom view of the oscillator 100. However, in FIG. 3, a lid 8b is not shown for convenience of description.

As shown in FIGS. 1 to 4, the oscillator 100 is configured to include an Integrated Circuit (IC) 2 which is an electronic component, a vibration element 3, a package (first case) 4, and a package (second case) 8.

The integrated circuit 2 is accommodated in the package 8. As described later, the integrated circuit (IC) 2 is configured to include an oscillation circuit 10, a temperature compensation circuit 40, and a temperature sensor 50 (see FIG. 6).

Examples of the vibration element 3 to be used may include a quartz crystal vibration element, a Surface Acoustic Wave (SAW) resonance element, other piezoelectric vibration elements or Micro Electro Mechanical Systems (MEMS) vibration elements, and the like. Examples of a substrate material of the vibration element 3 to be used may include a piezoelectric material such as piezoelectric single crystal, for example, quartz, lithium tantalate, and lithium niobate, piezoelectric ceramics, for example, lead zirconate titanate, a silicon semiconductor material, and the like. As excitation means of the vibration element 3, excitation means based on a piezoelectric effect may be used, or electrostatic driving based on a Coulomb force may be used.

The vibration element 3 includes a metal excitation electrode 3a and a metal excitation electrode 3b on the surface side and the rear surface side (two surfaces having a relationship between the inside and the outside), and oscillates at a desired frequency (frequency required for the oscillator 100) based on the mass of the vibration element 3 including the excitation electrode 3a and the excitation electrode 3b.

The package 4 includes a base (package base) 4a (first base) and a lid (cover) 4b (first lid) that seals the base 4a. The package 4 accommodates the vibration element 3. Specifically, the base 4a is provided with a recessed portion, a space 4c is formed by covering the recessed portion with the lid 4b, and the vibration element 3 is accommodated in the space 4c. The vibration element 3 is disposed on a first surface 15a of the base 4a.

Although the material of the base 4a is not particularly limited, various ceramics such as aluminum oxide can be used. Although the material of the lid 4b is not particularly limited, the material is a metal such as nickel, cobalt, or an iron alloy (for example, Kovar). In addition, the lid 4b may be a lid obtained by coating a plate-shaped member with such a metal.

A metal body for sealing may be provided between the base 4a and the lid 4b. The metal body may be a so-called seam ring constituted by, for example, a cobalt alloy for seam sealing, or may be configured by directly disposing a metal film on a ceramic material constituting the base 4a.

Figure 5:
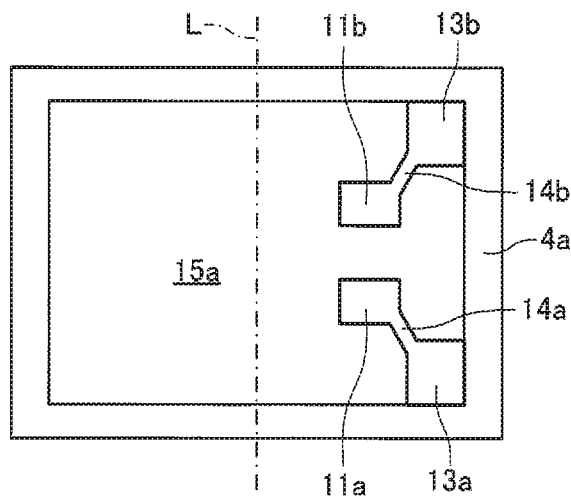
FIG. 5 is a schematic plan view showing a base of a package of the oscillator according to the exemplary embodiment.

FIG. 5 is a schematic plan view showing the base 4a of the package 4.

As shown in FIG. 5, electrode pads 11a and 11b, electrode pads 13a and 13b, and leading wirings 14a and 14b are provided on a first surface (the bottom surface of the recessed portion of the base 4a, a surface positioned on the inner side of the package 4 of the base 4a) 15a of the base 4a. Meanwhile, the base 4a includes a plate-shaped base body having the electrode pads 11a and 11b disposed therein, and a frame surrounding the first surface 15a.

The electrode pads 11a and 11b are electrically connected to the two excitation electrodes 3a and 3b of the vibration element 3, respectively. The electrode pads 11a and 11b and the vibration element 3 (excitation electrodes 3a and 3b) are bonded (adhered) to each other by a connection member 12 (see FIG. 2) such as a conductive adhesive.

The electrode pads 13a and 13b are electrically connected to the two external terminals 5a and 5b (see FIG. 3) of the package 4, respectively.

The leading wiring 14a electrically connects the electrode pad 11a and the electrode pad 13a to each other. The leading wiring 14b electrically connects the electrode pad 11b and the electrode pad 13b to each other.

As shown in FIG. 5, when a virtual straight line L passing through the center of the base 4a (first surface 15a) to divide the base 4a into two equal parts when seen in a plan view (when seen from a direction perpendicular to the first surface 15a of the base 4a) is drawn, the electrode pad 13a and the electrode pad 13b are positioned on a side where the electrode pad 11a and the electrode pad 11b are provided with respect to the virtual straight line L. Thereby, it is possible to reduce a difference between the length of the leading wiring 14a and the length of the leading wiring 14b. In the example shown in the drawing, the length of the leading wiring 14a and the length of the leading wiring 14b are equal to each other.

As shown in FIG. 2, the package 4 is bonded (adhered) to the package 8. Specifically, the lid 4b of the package 4 is bonded to the base 8a of the package 8. That is, the lid 4b is positioned on the bottom surface side of the recessed portion of the base 8a, and the base 4a is positioned on the lid 8b side. For this reason, in the example shown in FIG. 2, the lid 4b is positioned on the lower side and the base 4a is positioned on the upper side when the side of the lid 8b of the package 8 is assumed to be the upper side and the side of the base 8a is assumed to be the lower side. The lid 4b is disposed on a side opposite to the first surface 15a of the base 4a with respect to the vibration element 3.

The lid 4b and the base 8a are bonded (adhered) to each other by an adhesive member 9a. The adhesive member 9a is, for example, an insulating adhesive. An example of the insulating adhesive is a resin-based adhesive, such as an epoxy-based, silicon-based, or acryl-based adhesive, which is not mixed with a conductive material such as a metal filler.

Meanwhile, at least a portion of a surface of the lid 4b which is in contact with the adhesive member 9a may be in a rough state (roughened surface). In this case, a bonding state to the adhesive member 9a is improved, and thus impact resistance is improved. The roughened surface has irregularities by, for example, laser beam machining, and is rougher than, for example, a surface on an accommodation space (space 4c) side not having been subjected to such machining. In addition, the lid 4b may be warped so as to be projected toward the vibration element 3 side. Thereby, it is possible to increase a gap between the lid 4b and the base 8a and to decrease heat exchanging capacity between the lid 4b and the base 8a.

In this exemplary embodiment, the lid 4b of the package 4 is bonded to the base 8a of the package 8 as described above, and thus the vibration element 3 is positioned between the lid 4b and the lid 8b as shown in FIG. 2. The vibration element 3 is positioned in a region where the lid 4b and the lid 8b overlap each other when seen in a plan view (when seen from above the oscillator 100, when seen from a direction perpendicular to the bottom surface of the base 8a).

The external terminal 5a and the external terminal 5b electrically connected to the vibration element 3 are provided on the second surface 15b (surface on a side opposite to the first surface 15a) of the base 4a. The external terminal 5a and the external terminal 5b are positioned on one side with respect to the integrated circuit 2 on the second surface 15b, as shown in FIG. 3. In other words, the external terminal 5a and the external terminal 5b are positioned between one side of the integrated circuit 2 and one side of the second surface 15b when seen in a plan view. For this reason, it is possible to achieve a reduction in the size of the package 4, for example, as compared to a case where the external terminal 5a is positioned on one side of the integrated circuit 2 on the second surface 15b and the external terminal 5b is positioned on the other side of the integrated circuit 2 (for example, see FIG. 10).

The two external terminals 5a and 5b of the package 4 are electrically connected to two terminals (an XO terminal and an XI terminal of FIG. 6 to be described later) of the integrated circuit 2, respectively. In the example shown in the drawing, two external terminals 5a and 5b are respectively connected to two terminals of the integrated circuit 2 by bonding wires 7.

The integrated circuit 2 is bonded to the base 4a of the package 4. Specifically, the integrated circuit 2 is bonded to the second surface 15b of the base 4a. The integrated circuit 2 is configured to include a temperature sensor 50 to be described later and the oscillation circuit 10, and it can be said that the temperature sensor 50 and the oscillation circuit 10 are also disposed on the second surface 15b in a case where the integrated circuit 2 is disposed on the second surface 15b of the base 4a.

The integrated circuit 2 and the base 4a are bonded (adhered) to each other by the adhesive member 9b. The adhesive member 9b is, for example, a conductive adhesive. An example of the conductive adhesive is a resin-based adhesive, such as an epoxy-based, silicon-based, or acryl-based adhesive, which is mixed with a conductive material such as a metal filler.

As shown in FIG. 3, the integrated circuit 2 and the package 4 (vibration element 3) overlap each other when seen in a plan view. In addition, the vibration element 3 is disposed on the first surface 15a of the base 4a, and the integrated circuit 2 is disposed on the second surface 15b of the base 4a. For this reason, heat generated by the integrated circuit 2 is transmitted to the vibration element 3 in a short period of time, and thus it is possible to reduce a difference in temperature between the integrated circuit 2 and the vibration element 3.

Meanwhile, regarding the integrated circuit 2, at least a portion of a surface which is in contact with an adhesive member 9b may be in a rough state (roughened surface). Thereby, a bonding state to the adhesive member 9b is improved, and thus impact resistance and heat exchanging performance are improved. Meanwhile, the roughened surface may have striped irregularities formed by, for example, grinding. In addition, the second surface 15b of the base 4a may be warped so as to be recessed with respect to the integrated circuit 2. When a recess due to such a warp is positioned so as to overlap the integrated circuit 2, the adhesive member 9b is easily gathered in the recess. Thereby, since a sufficient amount of adhesive member 9b can be disposed between the integrated circuit 2 and the base 4a, adhesion between both the integrated circuit and the base is improved, and heat exchanging performance between the integrated circuit 2 and the base 4a, that is, the integrated circuit 2 and the vibration element 3 is improved.

The package 8 includes the base (package base) 8a (second base) and the lid (cover) 8b (second lid) that seals the base 8a. The package 8 accommodates the package 4 accommodating the vibration element 3 and the integrated circuit (IC) 2 in the same space. That is, the package 8 accommodates the package 4, the oscillation circuit 10, the temperature compensation circuit 40, and the temperature sensor 50 (see FIG. 6). Specifically, the base 8a is provided with a recessed portion, a space 8c is formed by covering the recessed portion with the lid 8b, and the integrated circuit 2 and the package 4 are accommodated in the space 8c.

A space is provided between the inner surface of the package 8 and the package 4. In the example shown in the drawing, the inner wall surface (inner surface) of the portion other than the bottom surface of the base 8a and the package 4 are not in contact with each other, and a space (gap) is provided therebetween. In addition, the lid 8b and the package 4 are not in contact with each other, and a space (gap) is provided therebetween.

A space is provided between the inner surface of the package 8 and the integrated circuit 2. In the example shown in the drawing, the inner wall surface of the base 8a and the integrated circuit 2 are not in contact with each other, and a space (gap) is provided therebetween. In addition, the lid 8b and the integrated circuit 2 are not in contact with each other, and a space (gap) is provided therebetween.

Although the material of the base 8a is not particularly limited, various ceramics such as aluminum oxide can be used. The material of the lid 8b is, for example, a metal. The material of the lid 8b may be the same as or may be different from the material of the lid 4b. The lid 8b in this exemplary embodiment has a plate shape, and the surface area of the lid 8b is smaller than the area of a gap shape having a recess. For this reason, it is easy to fend off wind from the side of the package, and thus it is possible to suppress a fluctuation in temperature due to outside air. For example, a sealing body is used for the bonding between the base 8a made of ceramic and the lid 8b. As the sealing body, a metal sealing body including a material such as a cobalt alloy or gold, or a non-metal sealing body such as glass or a resin can be used.

In the oscillator 100, a distance D1 (the shortest distance) between the lid 8b of the package 8 and the integrated circuit 2 is larger than a distance D2 (the shortest distance) between the integrated circuit 2 and the vibration element 3. In the example shown in the drawing, the distance D1 is a distance between the lower surface of the lid 8b and the upper surface of the integrated circuit 2, and the distance D2 is a distance between the lower surface of the integrated circuit 2 and the upper surface of the vibration element 3. In this manner, the integrated circuit 2 is brought closer to the vibration element 3 than the lid 8b, and thus it is possible to reduce a difference in temperature between the integrated circuit 2 and the vibration element 3.

A wiring, not shown in the drawing, which is electrically connected to each external terminal 6 is provided inside the base 8a or on the surface of the recessed portion, and each wiring and each terminal of the integrated circuit 2 are bonded to each other through a bonding wire 7 such as gold.

As shown in FIG. 4, four external terminals 6 of an external terminal VDD1 which is a power terminal, an external terminal VSS1 which is a ground terminal, an external terminal VC1 which is a terminal to which a signal for controlling frequency is input, and an external terminal OUT1 which is an output terminal are provided on the rear surface of the base 8a. A power supply voltage is supplied to the external terminal VDD1, and the external terminal VSS1 is grounded.

In the oscillator 100, a thermal conductivity of an atmosphere (first atmosphere) in the space 4c of the package 4 is higher than a thermal conductivity of an atmosphere (second atmosphere) in the space 8c of the package 8.

It is desirable that the atmosphere in the space 4c of the package 4 is a gas having a high thermal conductivity. The atmosphere in the space 4c of the package 4 is, for example, hydrogen or helium, or a mixed gas mainly containing these gases, and is more preferably helium. Helium has a high thermal conductivity and is an inert gas, and thus is preferably used as a gas filled in the space 4c of the package 4.

It is desirable that the atmosphere in the space 8c of the package 8 is a gas having a low thermal conductivity. The atmosphere in the space 8c of the package 8 is, for example, air. The atmosphere in the space 8c of the package 8 may be a rare gas, such as nitrogen or argon, which has a thermal conductivity lower than that of the gas in the space 4c, or may be a mixed gas mainly containing these gases.

The thermal conductivity of the atmosphere in the space 4c of the package 4 is set to be higher than the thermal conductivity of the atmosphere in the space 8c of the package 8, so that heat is easily transmitted between the integrated circuit 2 and the vibration element 3 and is hardly transmitted between the outside of the package 8 and the integrated circuit 2 accommodated in the package 8. For this reason, it is possible to transmit heat generated by the integrated circuit 2 to the vibration element 3 in a short period of time and to reduce the influence of a fluctuation in temperature outside the package 8 on the integrated circuit 2 and the vibration element 3. As a result, it is possible to reduce a difference in temperature between the integrated circuit 2 and the vibration element 3, that is, a difference in temperature between the temperature sensor 50 and the vibration element 3.

In the oscillator 100, the pressure of the atmosphere in the space 4c of the package 4 is higher than the pressure of the atmosphere in the space 8c of the package 8.

The pressure of the atmosphere in the space 4c of the package 4 is the same pressure (normal pressure) as, for example, atmospheric pressure. The atmosphere in the space 8c of the package 8 is, for example, vacuum (pressure lower than atmospheric pressure). More preferably, the pressure of the atmosphere in the space 8c of the package 8 is equal to or greater than $1 \times 10^{-3}$ Pa and equal to or less than 10 Pa.

The pressure of the atmosphere in the space 4c of the package 4 is set to be higher than the pressure of the atmosphere in the space 8c of the package 8, so that heat is easily transmitted between the integrated circuit 2 and the vibration element 3 and is hardly transmitted between the outside of the package 8 and the integrated circuit 2 accommodated in the package 8. For this reason, it is possible to reduce a difference in temperature between the integrated circuit 2 and the vibration element 3, that is, a difference in temperature between the temperature sensor 50 and the vibration element 3.

In this manner, in the oscillator 100, a thermal conductivity of the atmosphere in the space 4c of the package 4 is higher than a thermal conductivity of the atmosphere in the space 8c of the package 8, and the pressure of the atmosphere in the space 4c of the package 4 is higher than the pressure of the atmosphere in the space 8c of the package 8. For example, in the oscillator 100, the space 4c is filled with helium at normal pressure, and the space 8c is a vacuum (for example, a state where the space 8c filled with air is decompressed to be vacuumized).

Meanwhile, the pressure of the atmosphere in the space 4c of the package 4 may be set to be higher than atmospheric pressure. Thereby, heat is more easily transmitted between the integrated circuit 2 and the vibration element 3, and thus it is possible to further reduce a difference in temperature between the integrated circuit 2 and the vibration element 3.

Figure 6:
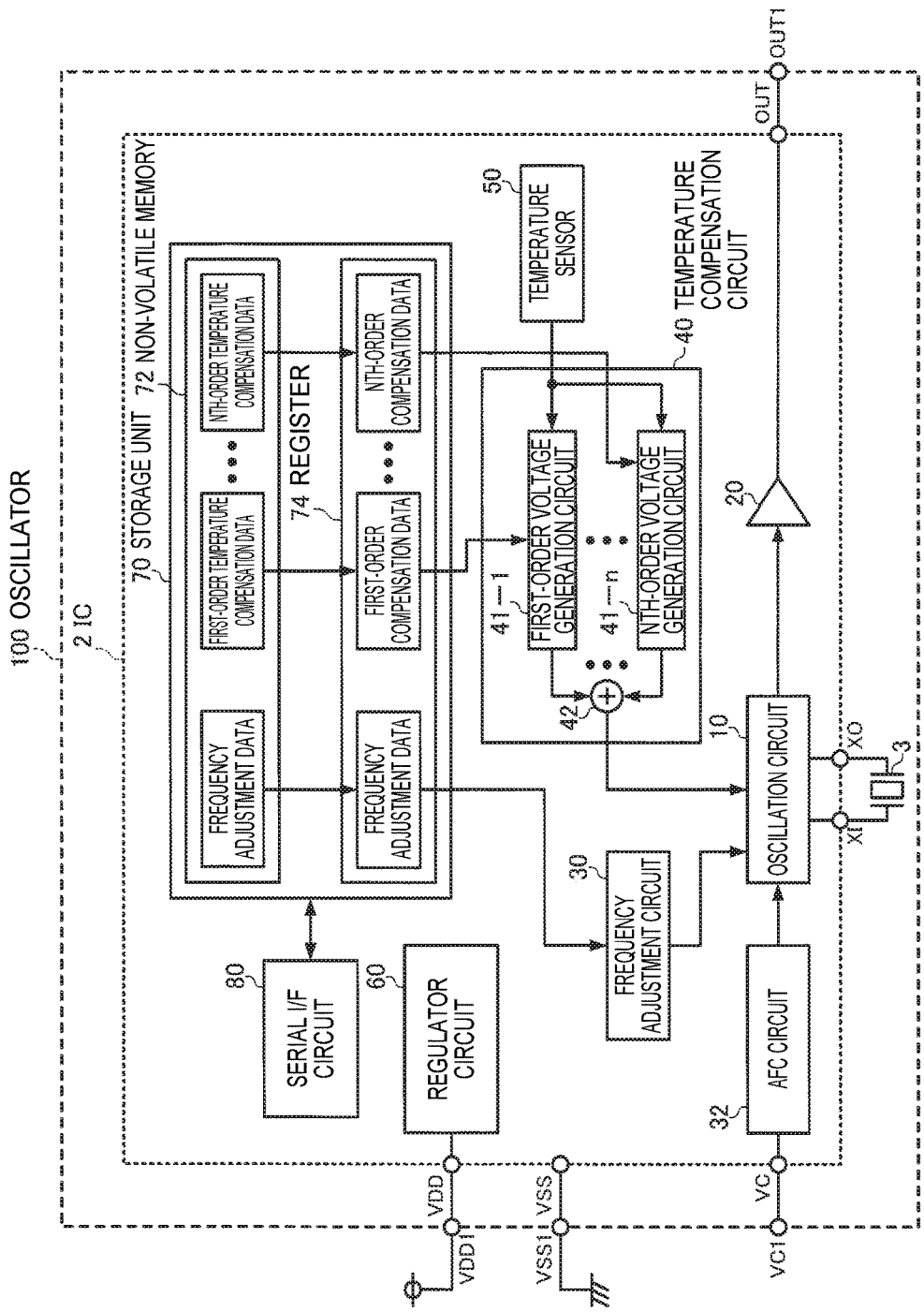
FIG. 6 is a functional block diagram of the oscillator according to the exemplary embodiment.

FIG. 6 is a functional block diagram of the oscillator 100. As shown in FIG. 6, the oscillator 100 is an oscillator including the vibration element 3 and the integrated circuit (IC) 2 for oscillating the vibration element 3.

The integrated circuit 2 is provided with a VDD terminal which is a power terminal, a VSS terminal which is a ground terminal, an OUT terminal which is an input-output terminal, a VC terminal which is a terminal to which a signal for controlling frequency is input, and an XI terminal and an XO terminal which are terminals for connection to the vibration element 3. The VDD terminal, the VSS terminal, the OUT terminal, and the VC terminal are exposed to the surface of the integrated circuit 2, and are respectively connected to the external terminals VDD1, VSS1, OUT1, and VC1 provided in the package 8. In addition, the XI terminal is connected to one end (one terminal) of the vibration element 3, and the XO terminal is connected to the other end (the other terminal) of the vibration element 3.

In this exemplary embodiment, the integrated circuit 2 is configured to include the oscillation circuit 10, an output circuit 20, a frequency adjustment circuit 30, an Automatic Frequency Control (AFC) circuit 32, a temperature compensation circuit 40, a temperature sensor 50, a regulator circuit 60, a storage unit 70, and a serial interface (I/F) circuit 80. Meanwhile, the integrated circuit 2 may be configured such that a portion of the components is omitted or changed or other components are added.

The regulator circuit 60 generates a constant voltage serving as a power supply voltage or a reference voltage of some or all of the oscillation circuit 10, the frequency adjustment circuit 30, the AFC circuit 32, the temperature compensation circuit 40, and the output circuit 20 on the basis of a power supply voltage VDD (positive voltage) which is supplied from the VDD terminal.

The storage unit 70 includes a non-volatile memory 72 and a register 74, and is configured such that reading and writing (hereinafter, reading/writing) with respect to the non-volatile memory 72 or the register 74 can be performed through the serial interface circuit 80 from the external terminal. In this exemplary embodiment, there are only four terminals VDD, VSS, OUT, and VC of the integrated circuit (IC) 2 which are connected to the external terminal of the oscillator 100, and thus the serial interface circuit 80 receives a clock signal which is input from the VC terminal and a data signal which is input from the OUT terminal, for example, when the voltage of the VDD terminal is higher than a threshold value, and performs the reading/writing of data on the non-volatile memory 72 or the register 74.

The non-volatile memory 72 is a storage unit for storing various pieces of control data. The non-volatile memory may be any of various rewritable non-volatile memories such as an Electrically Erasable Programmable Read-Only Memory (EEPROM) or a flash memory, or may be any of various non-rewritable non-volatile memories such as a One-Time Programmable Read Only Memory (one-time PROM).

The non-volatile memory 72 stores frequency adjustment data for controlling the frequency adjustment circuit 30, and temperature compensation data (first-order compensation data, . . . , and nth-order compensation data) for controlling the temperature compensation circuit 40. Further, the non-volatile memory 72 also stores pieces of data (not shown) for respectively controlling the output circuit 20 and the AFC circuit 32.

The frequency adjustment data is data for adjusting the frequency of the oscillator 100, and can be finely adjusted so that the frequency of the oscillator 100 approximates a desired frequency, by rewriting the frequency adjustment data in a case where the frequency of the oscillator 100 deviates from the desired frequency.

The temperature compensation data (the first-order compensation data, . . . , and the nth-order compensation data) is data for correcting a frequency temperature characteristic of the oscillator 100, the temperature compensation data being calculated in a temperature compensation adjustment process of the oscillator 100. For example, the temperature compensation data may be first to nth-order coefficient values based on respective order components of the frequency temperature characteristic of the vibration element 3. Here, as the maximum-order n of the temperature compensation data, a value capable of canceling the frequency temperature characteristic of the vibration element 3 and correcting the influence of a temperature characteristic of the integrated circuit 2 is selected. For example, n may be an integer value larger than a main order of the frequency temperature characteristic of the vibration element 3. For example, when the vibration element 3 is an AT cut quartz crystal vibration element, the frequency temperature characteristic represents a cubic curve, and the main order is 3. Accordingly, an integer value (for example, 5 or 6) which is larger than 3 may be selected as "n". Meanwhile, the temperature compensation data may include compensation data of all of the first-order to nth-order, or may include only compensation data of some of the first-order to nth-order.

The pieces of data stored in the non-volatile memory 72 are transmitted from the non-volatile memory 72 to the register 74 when the integrated circuit 2 is turned on (when the voltage of the VDD terminal rises from 0 V to a desired voltage), and are held in the register 74. The frequency adjustment data held in the register 74 is input to the frequency adjustment circuit 30, the temperature compensation data (the first-order compensation data, . . . , and the nth-order compensation data) which is held in the register 74 is input to the temperature compensation circuit 40, and the pieces of data for control which are held in the register 74 are also input to the output circuit 20 and the AFC circuit 32.

In a case where the non-volatile memory 72 is a non-rewritable memory, each data is directly written in each bit of the register 74 holding each data transmitted from the non-volatile memory 72 and is adjusted so that the oscillator 100 satisfies a desired characteristic through the serial interface circuit 80 from the external terminal during the examination of the oscillator 100, and the adjusted pieces of data are finally written in the non-volatile memory 72. In addition, in a case where the non-volatile memory 72 is a rewritable memory, the pieces of data may be written in the non-volatile memory 72 through the serial interface circuit 80 from the external terminal during the examination of the oscillator 100. However, since the writing in the non-volatile memory 72 generally takes time, each data may be written in each bit of the register 74 through the serial interface circuit 80 from the external terminal during the examination of the oscillator 100 in order to shorten an examination time, and the adjusted data may be finally written in the non-volatile memory 72.

The oscillation circuit 10 amplifies an output signal of the vibration element 3 to feed back the amplified output signal to the vibration element 3, thereby oscillating the vibration element 3 and outputting an oscillation signal based on the oscillation of the vibration element 3. For example, a current at an oscillation stage of the oscillation circuit 10 may be controlled on the basis of the control data held in the register 74.

The frequency adjustment circuit 30 generates a voltage based on the frequency adjustment data held in the register 74 and applies the generated voltage to one end of a variable capacitance element (not shown) functioning as a load capacity of the oscillation circuit 10. Thereby, control (fine adjustment) is performed so that an oscillation frequency (reference frequency) of the oscillation circuit 10 under conditions in which a predetermined temperature (for example, 25° C.) is set and the voltage of the VC terminal is set to a predetermined voltage (for example, VDD/2) is set to substantially a desired frequency.

The AFC circuit 32 generates a voltage based on the voltage of the VC terminal and applies the generated voltage to one end of the variable capacitance element (not shown) functioning as the load capacity of the oscillation circuit 10.

Thereby, an oscillation frequency (oscillation frequency of the vibration element 3) of the oscillation circuit 10 is controlled on the basis of the voltage value of the VC terminal. For example, a gain of the AFC circuit 32 may be controlled on the basis of the control data held in the register 74.

The temperature sensor 50 detects a temperature. The temperature sensor 50 is a temperature-sensitive element that outputs a signal (for example, a voltage based on a temperature) based on the ambient temperature. The temperature sensor 50 may be a positive polarity sensor in which an output voltage becomes higher as a temperature becomes higher, or may be a negative polarity sensor in which an output voltage becomes lower as a temperature becomes higher. Meanwhile, the temperature sensor 50 to be preferably used may be a temperature sensor in which an output voltage changes linearly as much as possible with respect to a change in temperature in a desired temperature range in which the operation of the oscillator 100 is guaranteed.

The temperature compensation circuit 40 compensates for a frequency temperature characteristic of the vibration element 3 on the basis of an output signal of the temperature sensor 50. The temperature compensation circuit 40 receives an input of an output signal from the temperature sensor 50, generates a voltage (temperature compensation voltage) for compensating for the frequency temperature characteristic of the vibration element 3, and applies the generated voltage to one end of the variable capacitance element (not shown) functioning as the load capacity of the oscillation circuit 10. Thereby, the oscillation frequency of the oscillation circuit 10 is controlled to substantially a constant frequency, irrespective of temperature. In this exemplary embodiment, the temperature compensation circuit 40 is configured to include a first-order voltage generation circuit 41-1 to an nth-order voltage generation circuit 41-n and an addition circuit 42.

An output signal from the temperature sensor 50 is input to each of the first-order voltage generation circuit 41-1 to the nth-order voltage generation circuit 41-n, and a first-order compensation voltage to an nth-order compensation voltage for respectively compensating for a first-order component to an nth-order component of the frequency temperature characteristic are generated on the basis of the first-order compensation data to the nth-order compensation data which are held in the register 74.

The addition circuit 42 adds up the first-order compensation voltage to the nth-order compensation voltage which are respectively generated by the first-order voltage generation circuit 41-1 to the nth-order voltage generation circuit 41-n and outputs the added-up voltage. The output voltage of the addition circuit 42 serves as an output voltage (temperature compensation voltage) of the temperature compensation circuit 40.

The output circuit 20 receives an input of an oscillation signal which is output by the oscillation circuit 10, generates an oscillation signal to be output to the outside, and outputs the generated oscillation signal to the outside through the OUT terminal. For example, a frequency division ratio and an output level of the oscillation signal in the output circuit 20 may be controlled on the basis of the control data held in the register 74. An output frequency range of the oscillator 100 is, for example, equal to or greater than 10 MHz and equal to or less than 800 MHz.

The oscillator 100 configured in this manner functions as a voltage controlled temperature compensated oscillator (Voltage Controlled Temperature Compensated Crystal Oscillator (VC-TCXO) when the vibration element 3 is a quartz crystal vibration element) which outputs an oscillation signal having a constant frequency based on the voltage of the external terminal VC1, irrespective of a temperature, in a desired temperature range.

1.2. Method of Manufacturing Oscillator

Figure 7:
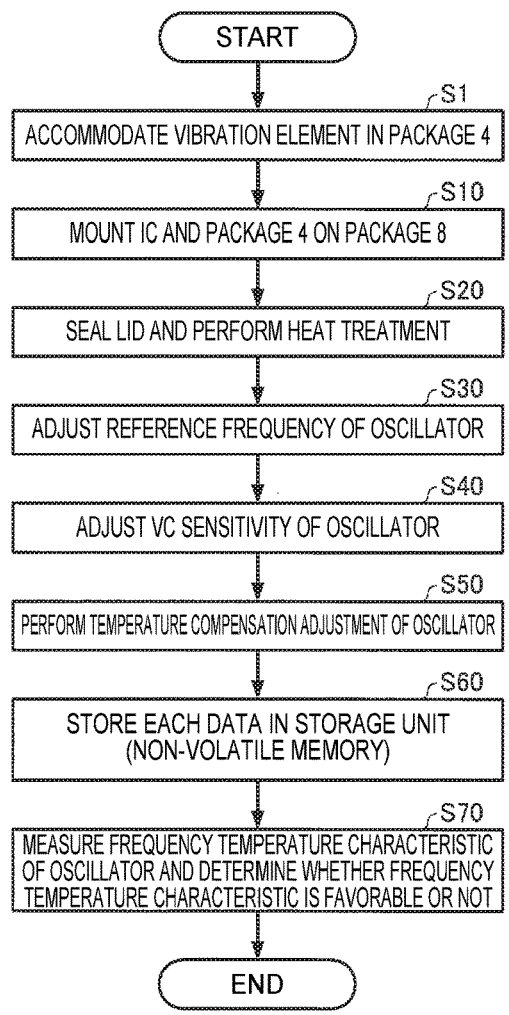
FIG. 7 is a flow chart showing an example of a procedure of a method of manufacturing the oscillator according to the exemplary embodiment.

FIG. 7 is a flow chart showing an example of a procedure of a method of manufacturing the oscillator 100 according to this exemplary embodiment. Some of step S1 and steps S10 to S70 in FIG. 7 may be omitted or changed, or other steps may be added. In addition, the order of the steps may be appropriately changed in a possible range.

First, the vibration element 3 is accommodated in the package 4 (S1). In step S1, first, the vibration element 3 is mounted on the base 4a, and the base 4a is sealed by the lid 4b. For example, in a case where the atmosphere in the space 4c of the package 4 is set to be helium, a step of sealing the base 4a by the lid 4b is performed in a helium atmosphere. Specifically, the lid 4b is bonded to the base 4a in a state where the base 4a and the lid 4b are disposed within a vacuum device and the vacuum device is set to be in a helium atmosphere state by exhausting the vacuum device and then flowing helium into the vacuum device. Thereby, the vibration element 3 can be accommodated in the package 4 in which the atmosphere in the space 4c is helium at normal pressure.

Next, the package 4 accommodating the integrated circuit 2 and the vibration element 3 is mounted on the package 8 (base 8a) (S10). The integrated circuit 2 and the external terminals 5a and 5b of the package 4 are connected to each other by step S10, and the integrated circuit 2 and the vibration element 3 are electrically connected to each other when the integrated circuit 2 is turned on.

Next, the base 8a is sealed by the lid 8b, and heat treatment is performed thereon, thereby bonding the lid 8b to the base 8a (S20). For example, in a case where the atmosphere in the space 8c of the package 8 is set to be vacuum, the sealing of the base 8a by the lid 8b is performed in a vacuum atmosphere. Specifically, the lid 8b is bonded to the base 8a in a state where the base 8a and the lid 8b are disposed within the vacuum device (the vacuum device is filled with, for example, air) and the vacuum device is set to be in a vacuum atmosphere state by exhausting the vacuum device. Thereby, the integrated circuit 2 and the vibration element 3 (package 4) can be accommodated in the package 8 in which the atmosphere in the space 8c is a vacuum.

It is possible to manufacture the oscillator 100 in which a thermal conductivity of the atmosphere in the space 4c of the package 4 is higher than a thermal conductivity of the atmosphere in the space 8c of the package 8 and the pressure of the atmosphere in the space 4c of the package 4 is higher than the pressure of the atmosphere in the space 8c of the package 8 by step S1, step S10, and step S20.

Next, a reference frequency (frequency at a reference temperature T0 (for example, 25° C.)) of the oscillator 100 is adjusted (S30). In step S30, a frequency is measured by oscillating the oscillator 100 at the reference temperature T0, and frequency adjustment data is determined so that a frequency deviation approximates to zero.

Next, a Voltage Control (VC) sensitivity of the oscillator 100 is adjusted (S40). The VC sensitivity is a ratio of a change in an oscillation frequency to a change in a control voltage. In step S40, a frequency is measured by oscillating the oscillator 100 in a state where a predetermined voltage (for example, 0 V or VDD) is applied to the external terminal VC1 at the reference temperature T0, and adjustment data of the AFC circuit 32 is determined so that a desired VC sensitivity is obtained.

Next, temperature compensation adjustment of the oscillator 100 is performed (S50). In this temperature compensation adjustment process S50, the frequency of the oscillator 100 is measured at a plurality of temperatures in a desired temperature range (for example, equal to or higher than −40° C. and equal to or lower than 105° C.), and temperature compensation data (the first-order compensation data, . . . , and the nth-order compensation data) for correcting the frequency temperature characteristic of the oscillator 100 is generated on the basis of measurement results. Specifically, a calculation program for the temperature compensation data approximates the frequency temperature characteristic (including a frequency temperature characteristic of the vibration element 3 and a temperature characteristic of the integrated circuit 2) of the oscillator 100 by an nth-order expression with a temperature (output voltage of the temperature sensor 50) as a variable by using the measurement results of the frequency at the plurality of temperatures, and generates the temperature compensation data (the first-order compensation data, . . . , and the nth-order compensation data) based on the approximate expression. For example, the calculation program for the temperature compensation data sets a frequency deviation at the reference temperature T0 to zero, and generates the temperature compensation data (the first-order compensation data, . . . , and the nth-order compensation data) for reducing the width of the frequency deviation in a desired temperature range.

Next, the pieces of data obtained in steps S30, S40, and S50 are stored in the non-volatile memory 72 of the storage unit 70 (S60).

Finally, the frequency temperature characteristic of the oscillator 100 is measured, and it is determined whether the frequency temperature characteristic is favorable or not (S70). In step S70, the frequency of the oscillator 100 is measured while gradually changing a temperature, and it is evaluated whether or not a frequency deviation is within a predetermined range in a desired temperature range (for example, equal to or higher than −40° C. and equal to or lower than 105° C.). It is determined that the frequency temperature characteristic is favorable when the frequency deviation is within the predetermined range, and it is determined that the frequency temperature characteristic is not favorable when the frequency deviation is not within the predetermined range.

1.3. Features

The oscillator 100 according to this exemplary embodiment has, for example, the following features.

In the oscillator 100, a thermal conductivity of the atmosphere in the space 4c of the package 4 is higher than a thermal conductivity of the atmosphere in the space 8c of the package 8. For this reason, in the oscillator 100, it is possible to reduce a difference in temperature between the integrated circuit 2 and the vibration element 3, that is, a difference in temperature between the temperature sensor 50 and the vibration element 3, as described above. As a result, in the oscillator 100, an error of temperature compensation by the temperature compensation circuit 40 is decreased as compared with a case where the thermal conductivity of the atmosphere in the space 8c of the package 8 is equal to or greater than the thermal conductivity of the atmosphere in the space 4c of the package 4, and thus the oscillator can have high frequency stability. Therefore, the oscillator 100 can have high frequency stability even under a severe temperature environment such as an environment in which the oscillator 100 receives wind or an environment in which temperature outside the oscillator 100 fluctuates (see "1.5. Experimental Example" to be described later).

In the oscillator 100, the atmosphere in the space 4c of the package 4 includes helium. Helium has a high thermal conductivity. For this reason, heat is easily transmitted between the integrated circuit 2 and the vibration element 3, and thus it is possible to reduce a difference in temperature between the integrated circuit 2 and the vibration element 3. Further, helium is an inert gas, and thus it is possible to safely manufacture the oscillator 100.

In the oscillator 100, the pressure of the atmosphere in the space 4c of the package 4 is higher than the pressure of the atmosphere in the space 8c of the package 8. For this reason, in the oscillator 100, it is possible to reduce a difference in temperature between the integrated circuit 2 and the vibration element 3, that is, a difference in temperature between the temperature sensor 50 and the vibration element 3, as described above. Therefore, the oscillator 100 can have high frequency stability even under a severe temperature environment (see "1.5. Experimental Example" to be described later).

In the oscillator 100, the atmosphere in the space 8c of the package 8 is a vacuum. For this reason, in the oscillator 100, heat is hardly transmitted between the outside of the package 8 and the integrated circuit 2 and vibration element 3 which are accommodated in the package 8, and thus it is possible to reduce a difference in temperature between the integrated circuit 2 and the vibration element 3.

In the oscillator 100, the pressure in the space 8c of the package 8 is equal to or greater than $1 \times 10^{-3}$ Pa and equal to or less than 10 Pa. For this reason, in the oscillator 100, heat is hardly transmitted between the outside of the package 8 and the integrated circuit 2 and vibration element 3 which are accommodated in the package 8, and thus it is possible to reduce a difference in temperature between the integrated circuit 2 and the vibration element 3.

In the oscillator 100, the package 4 includes the first surface 15a and the second surface 15b on a side opposite to the first surface 15a, the vibration element 3 is disposed on the first surface 15a, and the integrated circuit 2 including the temperature sensor 50 is disposed on the second surface 15b. For this reason, it is possible to reduce a difference in temperature between the integrated circuit 2 and the vibration element 3.

In the oscillator 100, the lid 4b of the package 4 and the base 8a of the package 8 are bonded to each other. For this reason, in the oscillator 100, the integrated circuit 2 can be disposed on the second surface 15b of the base 4a, and thus it is possible to reduce a difference in temperature between the integrated circuit 2 and the vibration element 3, as described above.

In the oscillator 100, the integrated circuit 2 and the external terminals 5a and 5b are disposed on the second surface 15b of the base 4a. For this reason, in the oscillator 100, it is possible to separate the external terminals 5a and 5b from the base 8a (the bottom surface of the recessed portion) of the package 8 and to reduce the influence of noise from the outside. Further, in the oscillator 100, the external terminals 5a and 5b are provided on the second surface 15b of the base 4a, and thus it is possible to reduce the length of a wiring between the vibration element 3 and the integrated circuit 2 (oscillation circuit 10) and to reduce the influence of noise. For example, in a case where the integrated circuit 2 is disposed at the lid 4b of the package 4 (for example, see FIG. 8), the vibration element 3 and the integrated circuit 2 are electrically connected to each other through a wiring provided inside the base 8a or on the surface of the recessed portion, and thus the length of the wiring is increased and the influence of noise is easily exerted.

In the oscillator 100, the vibration element 3 is positioned between the lid 4b of the package 4 and the lid 8b of the package 8. For this reason, in the oscillator 100, for example, the lid 4b and the lid 8b are formed of a metal, and thus it is possible to cause the lid 4b and the lid 8b to function as shields for shielding noise (electromagnetic noise) from the outside. Therefore, it is possible to reduce the influence of noise to the vibration element 3.

In the oscillator 100, the lid 4b of the package 4 and the base 8a of the package 8 are bonded to each other by the adhesive member 9a which is an insulating adhesive. The insulating adhesive hardly transmits heat, as compared to a conductive adhesive. For this reason, in the oscillator 100, it is possible to reduce the influence of a fluctuation in temperature outside the package 8 on the integrated circuit 2 and the vibration element 3 which are accommodated in the package 8. As a result, it is possible to reduce a difference in temperature between the integrated circuit 2 and the vibration element 3.

In the oscillator 100, the base 4a of the package 4 and the integrated circuit 2 are bonded to each other by the adhesive member 9b which is a conductive adhesive. For this reason, in the oscillator 100, heat generated by the integrated circuit 2 is transmitted to the vibration element 3 in a short period of time, and thus it is possible to reduce a difference in temperature between the integrated circuit 2 and the vibration element 3.

In the oscillator 100, when the virtual straight line L passing through the center of the base 4a to divide the base 4a into two equal parts when seen in a plan view is drawn as shown in FIG. 5, the electrode pad 13a and the electrode pad 13b are positioned on a side where the electrode pad 11a and the electrode pad 11b are provided with respect to the virtual straight line L. For this reason, in the oscillator 100, it is possible to reduce a difference between the length of the leading wiring 14a and the length of the leading wiring 14b (or it is possible to equalize the lengths to each other), for example, as compared to a case where the electrode pad 13a and the electrode pad 13b are disposed at the opposite angles of the base 4a (for example, see FIG. 11). As a result, it is possible to reduce a difference between a path length of a path through which heat from the outside of the package 4 is transmitted to a vibration element 3 through the electrode pad 13a, the leading wiring 14a, and the electrode pad 11a and a path length of a path through which heat is transmitted to the vibration element 3 through the electrode pad 13b, the leading wiring 14b, and the electrode pad 11b. Thereby, it is possible to reduce temperature unevenness of the vibration element 3 and to further reduce a difference in temperature between the integrated circuit 2 and the vibration element 3.

Meanwhile, a description has been given of an example in which the temperature sensor 50 is embedded into the integrated circuit 2. Although not shown in the drawing, the temperature sensor 50 may not be embedded into the integrated circuit 2. In this case, at least the temperature sensor 50 may be disposed on the second surface 15b of the base 4a of the package 4. Thereby, it is possible to reduce a difference in temperature between the temperature sensor 50 and the vibration element 3 and to reduce an error of temperature compensation by the temperature compensation circuit 40.

1.4. Modification Example of Oscillator

Next, modification examples of the oscillator according to this exemplary embodiment will be described.

(1) First Modification Example

Figure 8:
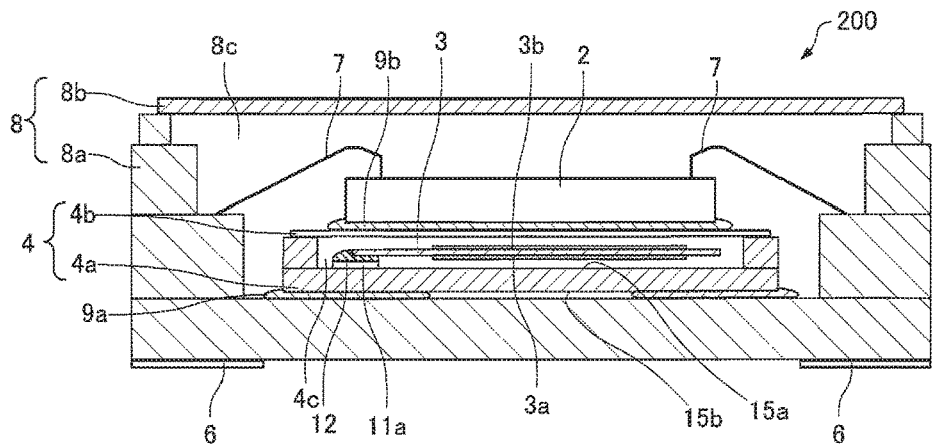
FIG. 8 is a schematic cross-sectional view showing an example of the structure of an oscillator according to a first modification example.

FIG. 8 is a schematic cross-sectional view showing an example of the structure of an oscillator 200 according to a first modification example, and corresponds to FIG. 2. Hereinafter, in the oscillator 200, members having the same functions as the components of the oscillator 100 will be denoted by the same reference numerals and signs, and a description thereof will be omitted.

In the oscillator 100 described above, the lid 4b of the package 4 and the base 8a of the package 8 are bonded to each other, as shown in FIG. 2.

On the other hand, in the oscillator 200, a base 4a of a package 4 and a base 8a of a package 8 are bonded to each other, as shown in FIG. 8. In the oscillator 200, a second surface 15b of the base 4a is bonded to the base 8a.

The base 4a and the base 8a are adhered to each other by an adhesive member 9a. The adhesive member 9a is a conductive adhesive, and connects an external terminal (not shown) of the package 4 and a wiring provided on the surface of the base 8a.

Wirings, not shown in the drawing, for electrically connecting two terminals (an XO terminal and an XI terminal of FIG. 6) of an integrated circuit 2 and two terminals (excitation electrode 3a and excitation electrode 3b) of the vibration element 3 are provided inside the base 8a or on the surface of a recessed portion.

The integrated circuit 2 is bonded to a lid 4b of the package 4. The integrated circuit 2 is adhered (fixed) to the lid 4b by the adhesive member 9b. The adhesive member 9b is, for example, a conductive adhesive.

In the oscillator 200, a thermal conductivity of an atmosphere in a space 4c of the package 4 is higher than a thermal conductivity of an atmosphere in a space 8c of the package 8, similar to the oscillator 100. In addition, the pressure of the atmosphere in the space 4c of the package 4 is higher than the pressure of the atmosphere in the space 8c of the package 8. For this reason, according to the oscillator 200, it is possible to reduce a difference in temperature between the integrated circuit 2 and the vibration element 3 and to have high frequency stability even under a severe temperature environment, similar to the oscillator 100.

(2) Second Modification Example

Figure 9:
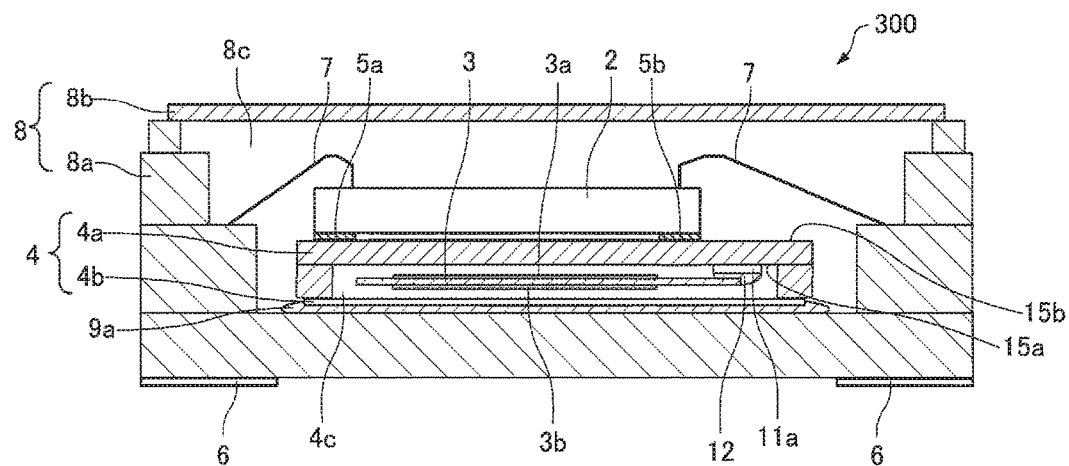
FIG. 9 is a schematic cross-sectional view showing an example of the structure of an oscillator according to a second modification example.

FIG. 9 is a schematic cross-sectional view showing an example of the structure of an oscillator 300 according to a second modification example, and corresponds to FIG. 2. Hereinafter, in the oscillator 300, members having the same functions as the components of the oscillator 100 will be denoted by the same reference numerals and signs, and a description thereof will be omitted.

In the oscillator 100 described above, the external terminals 5a and 5b are connected to two terminals (the XO terminal and the XI terminal of FIG. 6) of the integrated circuit 2 through the bonding wires 7, as shown in FIGS. 2 and 3.

On the other hand, in the oscillator 300, external terminals 5a and 5b are connected to two terminals of the integrated circuit 2 through a metal bump, a silver paste, or the like, as shown in FIG. 9.

In the oscillator 300, it is possible to exhibit the same operational effects as those of the oscillator 100.

(3) Third Modification Example

Figure 10:
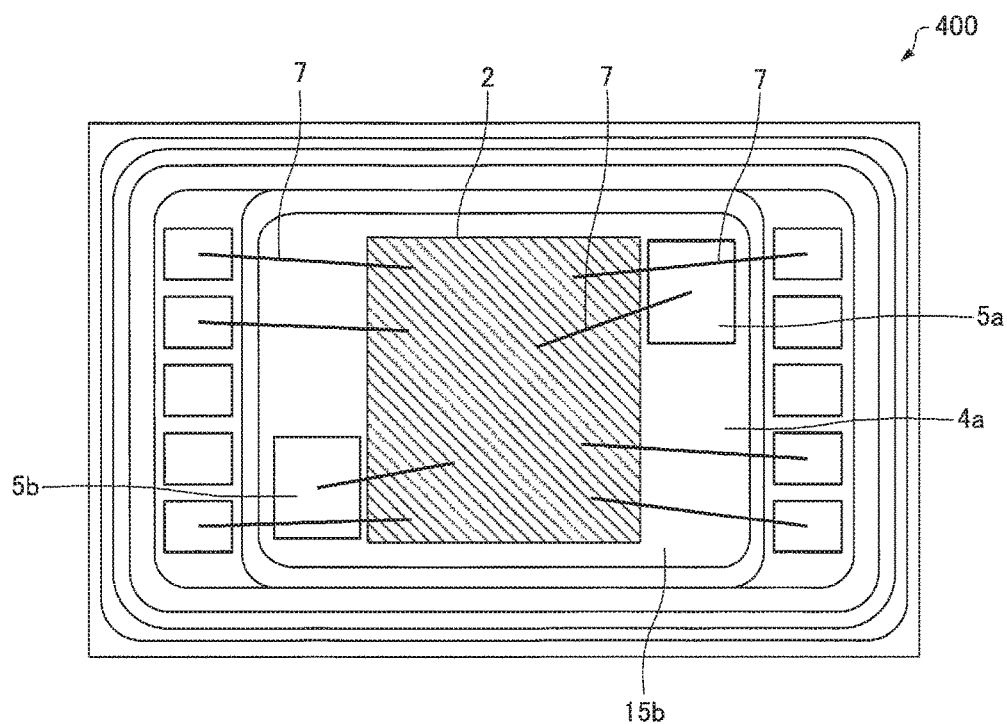
FIG. 10 is a schematic top view showing an example of the structure of an oscillator according to a third modification example.
Figure 11:
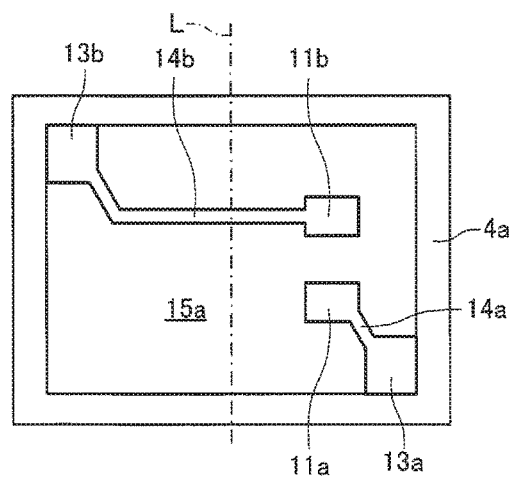
FIG. 11 is a schematic plan view showing a base of a package of the oscillator according to the third modification example.

FIG. 10 is a schematic top view showing an example of the structure of an oscillator 400 according to a third modification example, and corresponds to FIG. 3. FIG. 11 is a schematic plan view showing a base 4a of a package 4, and corresponds to FIG. 5. Hereinafter, in the oscillator 400, members having the same functions as the components of the oscillator 100 will be denoted by the same reference numerals and signs, and a description thereof will be omitted.

In the oscillator 100 described above, the external terminal 5a and the external terminal 5b are positioned on one side of the integrated circuit 2 on the second surface 15b of the base 4a of the package 4, as shown in FIG. 3.

On the other hand, in the oscillator 400, an external terminal 5a is positioned on one side of an integrated circuit 2 and an external terminal 5b is positioned on the other side of the integrated circuit 2 on a second surface 15b of a base 4a of a package 4, as shown in FIG. 10. In the example shown in the drawing, the external terminal 5a and the external terminal 5b are positioned at the opposite angles of the second surface 15b of the base 4a.

In the oscillator 400, when a virtual straight line L passing through the center of the base 4a (first surface 15a) to divide the base 4a into two equal parts when seen in a plan view is drawn as shown in FIG. 11, an electrode pad 13a, an electrode pad 11a, and an electrode pad 11b are positioned on one side of the base 4a divided into two equal parts, and an electrode pad 13b is positioned on the other side of the base 4a divided into two equal parts. In the example shown in the drawing, the electrode pad 13a and the electrode pad 13b are positioned at the opposite angles of the first surface 15a of the base 4a.

In the oscillator 400, it is possible to exhibit the same operational effects as those of the oscillator 100.

(4) Fourth Modification Example

In the oscillator 100 described above, the thermal conductivity of the atmosphere in the space 4c of the package 4 shown in FIG. 2 is higher than the thermal conductivity of the atmosphere in the space 8c of the package 8, and the pressure of the atmosphere in the space 4c of the package 4 is higher than the pressure of the atmosphere in the space 8c of the package 8.

On the other hand, in this modification example, a thermal conductivity of an atmosphere in a space 4c of a package 4 may be higher than a thermal conductivity of an atmosphere in a space 8c of a package 8, and the pressure of the atmosphere in the space 4c of the package 4 may be the same as the pressure of the atmosphere in the space 8c of the package 8. For example, the atmosphere in the space 4c may be helium, the atmosphere in the space 8c may be nitrogen, and the pressure of the atmosphere in the space 4c and the pressure of the atmosphere in the space 8c may be the same as each other (for example, may be the same pressure as atmospheric pressure). Also in this case, it is possible to reduce a difference in temperature between an integrated circuit 2 and a vibration element 3.

In this modification example, the thermal conductivity of the atmosphere in the space 4c of the package 4 may be the same as the thermal conductivity of the atmosphere in the space 8c of the package 8, and the pressure of the atmosphere in the space 4c of the package 4 may be higher than the pressure of the atmosphere in the space 8c of the package 8. For example, the atmosphere in the space 4c and the atmosphere in the space 8c may be nitrogen, the pressure of the atmosphere in the space 4c may be the same pressure as atmospheric pressure, and the atmosphere in the space 8c may be a vacuum. Also in this case, it is possible to reduce a difference in temperature between the integrated circuit 2 and the vibration element 3.

(5) Fifth Modification Example

In the oscillator 100 described above, a material of the lid 8b of the package 8 shown in FIG. 2 is a metal, but the material of the lid 8b may be various ceramic materials such as an aluminum oxide. The ceramics have a thermal conductivity lower than that of a metal. For this reason, the lid 8b is formed of a ceramic material, and thus it is possible to reduce the influence of a fluctuation in temperature outside the package 8 on an integrated circuit 2 and a vibration element 3 which are accommodated in a package 8, for example, as compared to a case where the material of the lid 8b is a metal. As a result, it is possible to reduce a difference in temperature between the integrated circuit 2 and the vibration element 3.

Meanwhile, the material of the lid 8b is not limited to a ceramic material, and may be any material as long as the material can seal a base 8a and has a low thermal conductivity.

1.5. Experimental Example

An experimental example will be described below, and the invention will be described more specifically. Meanwhile, the invention is not limited at all by the following experimental example.

(1) Oscillator

A configuration of an oscillator E used in this experiment is the same as the above-described "1.1. Configuration of Oscillator" (see FIGS. 1 to 4). Specifically, in the oscillator E, a lid 4b of a package 4 is bonded to a base 8a of a package 8. In addition, an atmosphere in a space 4c of a package 4 is helium, and an atmosphere in a space 8c of the package 8 is air. In addition, the pressure of the atmosphere in the space 4c of the package 4 is the same pressure as atmospheric pressure, and the pressure of the atmosphere in the space 8c of the package 8 is approximately $1 \times 10^{-2}$ Pa. In addition, a vibration element 3 is a quartz crystal vibration element. In addition, the materials of a base 4a and the base 8a are ceramic materials, and the materials of the lid 4b and a lid 8b are metals.

As a comparative example, an oscillator C1 and an oscillator C2 are prepared.

The oscillator C1 is configured such that a base 4a of a package 4 and a base 8a of a package 8 are bonded to each other, as shown in FIG. 8. In the oscillator C1, an atmosphere in a space 4c of the package 4 and an atmosphere in a space 8c of the package 8 are nitrogen, and the pressure of the atmosphere in the space 4c of the package 4 and the pressure of the atmosphere in the space 8c of the package 8 are the same pressure as atmospheric pressure. The other configurations are the same as those of the oscillator E.

The oscillator C2 is the same as the oscillator E except that an atmosphere in a space 4c of a package 4 and an atmosphere in a space 8c of a package 8 are nitrogen, and the pressure of the atmosphere in the space 4c of the package 4 and the pressure of the atmosphere in the space 8c of the package 8 are the same pressure as atmospheric pressure.

(2) Difference in Temperature Between Temperature Sensor and Vibration Element

Heat transfer analysis (simulation) is performed using models of the oscillator E, the oscillator C1, and the oscillator C2 to examine temperature conditions of the vibration element 3 and the temperature sensor 50. Specifically, the temperature of the temperature sensor 50 embedded into the integrated circuit 2 and the temperature of the vibration element 3 are obtained through heat transfer analysis by using a portion of the integrated circuit 2 of the oscillator as a heater (heat source), so that a difference in temperature between the temperature sensor 50 and the vibration element 3 is calculated.

In this analysis, an environment in which the oscillator is disposed is set to be an environment in which the oscillator receives wind having a flow velocity of 3 m/s at a fixed temperature of 25° C.

Figure 12:
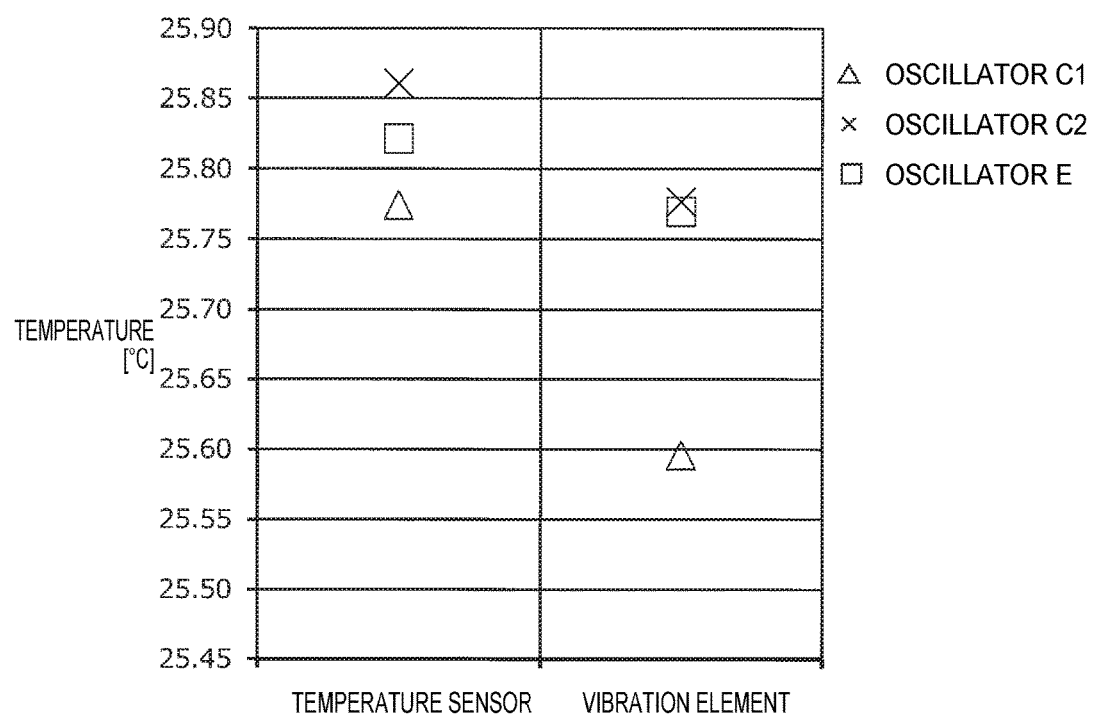
FIG. 12 is a graph showing results of heat transfer analysis.

Table 1 shown below is a table showing results of the heat transfer analysis. FIG. 12 is a graph showing results of the heat transfer analysis.

TABLE 1

|  | Heater [° C.] | Temperature Sensor [° C.] | Vibration Element [° C.] | Difference in Temperature [° C.] |
| --- | --- | --- | --- | --- |
| Oscillator C1 | 25.82 | 25.78 | 25.60 | 0.18 |
| Oscillator C2 | 25.91 | 25.86 | 25.78 | 0.08 |
| Oscillator E | 25.87 | 25.82 | 25.77 | 0.05 |

As shown in Table 1 and FIG. 12, in the oscillator C2, a difference in temperature between the temperature sensor 50 and the vibration element 3 is reduced as compared to the oscillator C1. From this result, it can be understood that it is possible to reduce a difference in temperature between the temperature sensor 50 and the vibration element 3 by bonding the lid 4b to the base 8a, as compared to a case where the base 4a and the base 8a are bonded to each other.

In the oscillator E, a difference in temperature between the temperature sensor 50 and the vibration element 3 is reduced as compared to the oscillator C2. From this result, it can be understood that it is possible to reduce a difference in temperature between the temperature sensor 50 and the vibration element 3 by setting a thermal conductivity of an atmosphere in the space 4c to be higher than a thermal conductivity of an atmosphere in the space 8c and setting the pressure of the atmosphere in the space 4c to be higher than the pressure of the atmosphere in the space 8c, as compared to a case where the thermal conductivity and the pressure of the atmosphere in the space 4c are set to be the same as those in the space 8c.

(3) Measurement of Allan Deviation (ADEV)

Short-term frequency stability of each of the oscillator E, the oscillator C1, and the oscillator C2 was evaluated by measuring Allan deviation (ADEV). In this measurement, the Allan deviation (ADEV) was measured in a state where the oscillator E was put into a thermostatic case having a fixed temperature of 25° C. and wind having a flow velocity of 3 m/s was received. The same measurement was performed on the oscillator C1 and the oscillator C2.

Table 2 shown below is a table showing results of measurement of Allan deviation (ADEV).

TABLE 2

|  | Difference in Temperature [° C.] | ADEV [$\times 10^{-11}$] |
| --- | --- | --- |
| Oscillator C1 | 0.18 | 10 |
| Oscillator C2 | 0.08 | 6 |
| Oscillator E | 0.05 | 4.5 |

As shown in Table 2, in the oscillator C2, Allan deviation is $6 \times 10^{-11}$ at a measurement time interval of one second, and it can be understood that frequency stability is higher than that in the oscillator C1. From this result, it can be understood that high frequency stability is obtained by bonding the lid 4b of the package 4 to the base 8a of the package 8, as compared to a case where the base 4a and the base 8a are bonded to each other.

In the oscillator E, Allan deviation is $4.5 \times 10^{-11}$ at a measurement time interval of one second, which means that the oscillator E has extremely high frequency stability. It can be understood that the frequency stability is higher than that in the oscillator C2. From this result, it can be understood that high frequency stability is obtained by setting a thermal conductivity of an atmosphere in the space 4c to be higher than a thermal conductivity of an atmosphere in the space 8c and setting the pressure of the atmosphere in the space 4c to be higher than the pressure of the atmosphere in the space 8c, as compared to a case where the thermal conductivity and the pressure of the atmosphere in the space 4c are set to be the same as those in the space 8c.

From this experimental example, it can be understood that the oscillator E can reduce a difference in temperature between the temperature sensor 50 and the vibration element 3 and has high frequency stability even under a severe temperature environment in which the oscillator receives wind.

2. Electronic Apparatus

Figure 13:
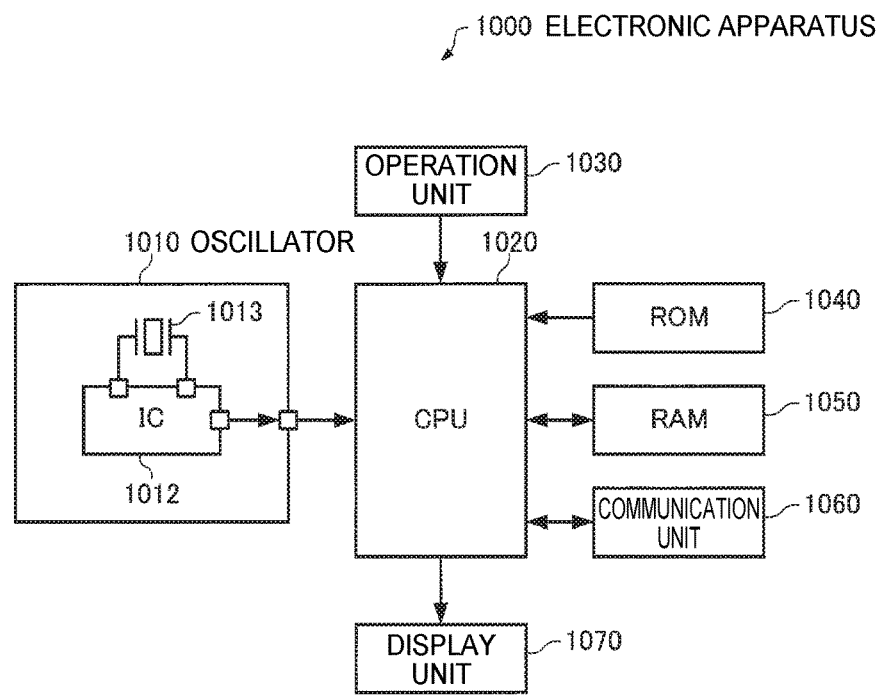
FIG. 13 is a functional block diagram showing an example of a configuration of an electronic apparatus according to the exemplary embodiment.
Figure 14:
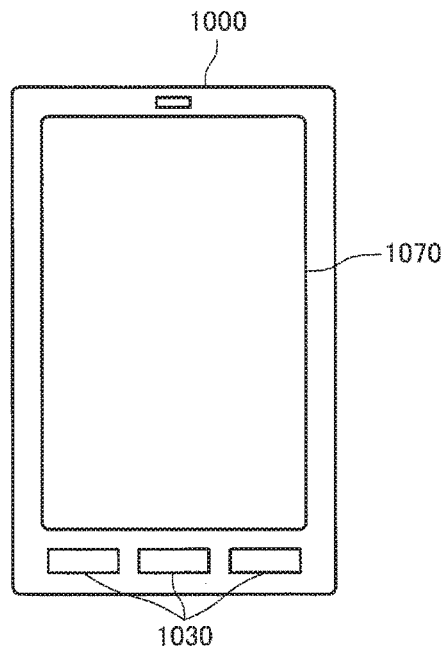
FIG. 14 is a diagram showing an example of the appearance of the electronic apparatus according to the exemplary embodiment.

FIG. 13 is a functional block diagram showing an example of a configuration of an electronic apparatus according to this exemplary embodiment. In addition, FIG. 14 is a diagram showing an example of the appearance of a smart phone which is an example of the electronic apparatus according to this exemplary embodiment.

An electronic apparatus 1000 according to this exemplary embodiment is configured to include an oscillator 1010, a Central Processing Unit (CPU) 1020, an operation unit 1030, a Read Only Memory (ROM) 1040, a Random Access Memory (RAM) 1050, a communication unit 1060, and a display unit 1070. Meanwhile, the electronic apparatus according to this exemplary embodiment may be configured such that a portion of the components (units) of FIG. 13 is omitted or changed or other components are added.

The oscillator 1010 includes an integrated circuit (IC) 1012 and a vibration element 1013. The integrated circuit (IC) 1012 oscillates the vibration element 1013 to generate an oscillation signal. The oscillation signal is output to the CPU 1020 from an external terminal of the oscillator 1010.

The CPU 1020 performs various types of calculation processes and control processes using the oscillation signal which is input from the oscillator 1010 as a clock signal, in accordance with a program stored in the ROM 1040 or the like. Specifically, the CPU 1020 performs various types of processes in response to an operation signal from the operation unit 1030, a process of controlling the communication unit 1060 in order to perform data communication with an external device, a process of transmitting a display signal for causing the display unit 1070 to display various pieces of information, and the like.

The operation unit 1030 is an input device constituted by operation keys, button switches or the like, and outputs an operation signal in response to a user's operation to the CPU 1020.

The ROM 1040 stores programs, data, or the like for causing the CPU 1020 to perform various types of calculation processes and control processes.

The RAM 1050 is used as a work area of the CPU 1020, and temporarily stores programs and data which are read out from the ROM 1040, data which is input from the operation unit 1030, computation results executed by the CPU 1020 in accordance with various types of programs, and the like.

The communication unit 1060 performs a variety of control for establishing data communication between the CPU 1020 and an external device.

The display unit 1070 is a display device constituted by a liquid crystal display (LCD) or the like, and displays various pieces of information on the basis of a display signal which is input from the CPU 1020. The display unit 1070 may be provided with a touch panel functioning as the operation unit 1030.

The oscillator according to the invention (for example, the oscillator 100) is applied as the oscillator 1010, and thus it is possible to realize the electronic apparatus including the oscillator having excellent frequency stability even under a severe temperature environment.

As the electronic apparatus 1000, various electronic apparatuses are considered. For example, the electronic apparatus includes a personal computer (for example, mobile-type personal computer, laptop personal computer, or tablet personal computer), a mobile terminal such as a smart phone and a cellular phone, a digital still camera, an ink jet ejecting device (for example, ink jet printer), a storage area network apparatus such as a router or a switch, a local area network apparatus, an apparatus for a mobile terminal base station, a television, a video camera, a video recorder, a car navigation device, a real-time clocking device, a pager, an electronic notebook (also including a communication function), an electronic dictionary, an electronic calculator, an electronic game console, a game controller, a word processor, a workstation, a TV phone, a security TV monitor, electronic binoculars, a Point Of Sale (POS) terminal, a medical instrument (for example, electronic thermometer, sphygmomanometer, blood glucose monitoring system, electrocardiogram measurement device, ultrasound diagnostic device, and electronic endoscope), a fish detector, various types of measuring apparatus, meters and gauges (for example, meters and gauges of a vehicle, an aircraft, and a vessel), a flight simulator, a head mounted display, a motion tracer, a motion tracker, a motion controller, a Personal Digital Assistant (PDR, walker position and direction measurement), and the like.

Examples of the electronic apparatus 1000 according to this exemplary embodiment include a transmission device functioning as a device for terminal base station that communicates with a terminal in a wired or wireless manner by using the above-described oscillator 1010 as a reference signal source, a voltage variable oscillator (VCO), or the like. The oscillator 100 is applied as the oscillator 1010, and thus it is possible to realize the electronic apparatus which is usable for, for example, a communication base station or the like and which requires high performance and high reliability.

In addition, another example of the electronic apparatus 1000 according to this exemplary embodiment is a communication device in which the communication unit 1060 receives an external clock signal, and the CPU 1020 (processing unit) includes a frequency control unit that controls the frequency of the oscillator 1010 on the basis of the external clock signal and an output signal (internal clock signal) of the oscillator 1010. The communication device may be a communication apparatus which is used in a base system network apparatus, such as a stratum 3, or a femtocell.

3. Vehicle

Figure 15:
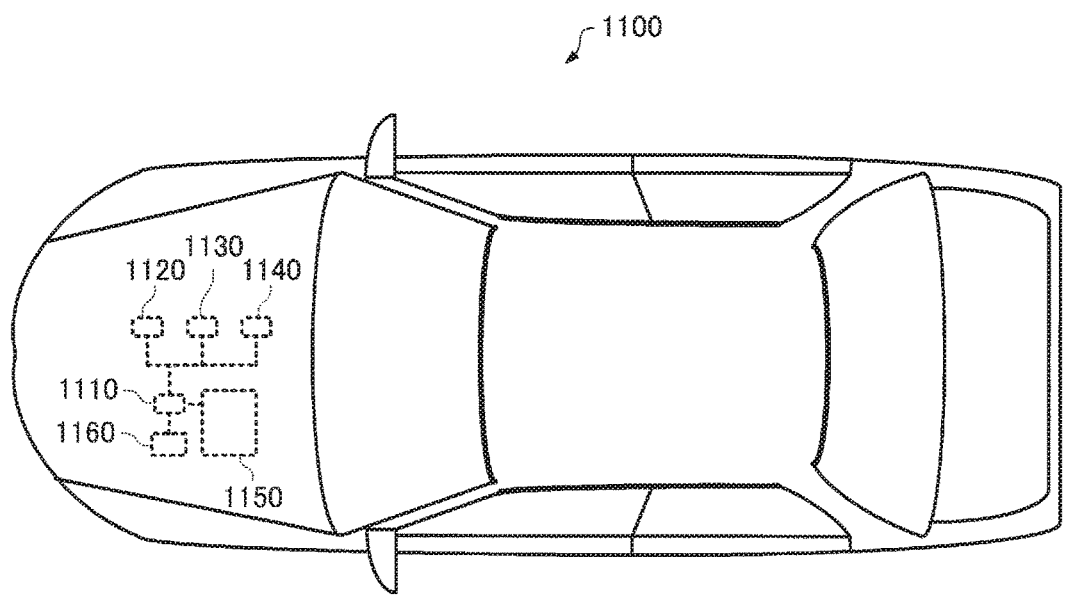
FIG. 15 is a diagram showing an example of a vehicle according to the exemplary embodiment.

FIG. 15 is a diagram (top view) showing an example of the vehicle according to this exemplary embodiment. The vehicle 1100 shown in FIG. 15 is configured to include an oscillator 1110, controllers 1120, 1130, and 1140 that perform a variety of control of an engine system, a brake system, a keyless entry system and the like, a battery 1150, and a backup battery 1160. Meanwhile, the vehicle according to this exemplary embodiment may be configured such that a portion of the components (units) of FIG. 15 is omitted or changed or other components are added.

The oscillator 1110 includes an integrated circuit (IC) and a vibration element which are not shown in the drawing, and the integrated circuit (IC) oscillates the vibration element to generate an oscillation signal. The oscillation signal is output to the controllers 1120, 1130, and 1140 from an external terminal of the oscillator 1110, and is used as, for example, a clock signal.

The battery 1150 supplies power to the oscillator 1110 and the controllers 1120, 1130, and 1140. The backup battery 1160 supplies power to the oscillator 1110 and the controllers 1120, 1130, and 1140 when an output voltage of the battery 1150 is lower than a threshold value.

The oscillator according to the invention (for example, the oscillator 100) is applied as the oscillator 1110, and thus it is possible to realize the vehicle including the oscillator having excellent frequency stability even under a severe temperature environment.

Various mobile bodies are considered as such a vehicle 1100. The vehicle includes, for example, an automobile (also including an electric automobile), an aircraft such as a jet engine airplane or a helicopter, a vessel, a rocket, a satellite, and the like.

The above-described exemplary embodiment and modification examples are merely examples, and the invention is not limited thereto. For example, the exemplary embodiment and the modification examples can also be appropriately combined with each other.

The invention includes configurations (for example, configurations having the same functions, methods and results, or configurations having the same objects and effects) which are substantially the same as the configurations described in the above exemplary embodiments. In addition, the invention includes configurations in which non-essential elements of the configurations described in the exemplary embodiments are replaced. In addition, the invention includes configurations exhibiting the same operations and effects as, or configurations capable of achieving the same objects as, the configurations described in the exemplary embodiments. In addition, the invention includes configurations with known techniques being added to the configurations described in the exemplary embodiments.

What is claimed is:

1. An oscillator comprising:
   a vibration element;
   an oscillation circuit configured to oscillate the vibration element and output an oscillation signal;
   a temperature sensor;
   a temperature compensation circuit configured to compensate for a frequency temperature characteristic of the vibration element based on an output signal of the temperature sensor;
   a first case enclosing the vibration element, the first case including a first lid and having a first atmosphere; and
   a second case enclosing the first case, the oscillation circuit, the temperature sensor, and the temperature compensation circuit, the second case including a second base and having a second atmosphere, the first atmosphere having a higher thermal conductivity than a thermal conductivity of the second atmosphere, the first lid being bonded to the second base.

2. The oscillator according to claim 1, wherein the first atmosphere has a higher pressure than a pressure of the second atmosphere.

3. The oscillator according to claim 1, wherein:
   the first case includes a first base, the first base including:
      a first surface, and
      a second surface on a side opposite to the first surface,
   the vibration element is disposed on the first surface, and
   the temperature sensor is disposed on the second surface.

4. The oscillator according to claim 3, further comprising:
   a terminal disposed on the second surface and electrically connected to the vibration element, and
   wherein the oscillation circuit is disposed on the second surface.

5. The oscillator according to claim 3, wherein the first lid is disposed on a side opposite to the first surface with respect to the vibration element.

6. The oscillator according to claim 5, wherein the first lid and the second base are bonded by an insulating adhesive.

7. The oscillator according to claim 1, wherein the first atmosphere includes helium.

8. The oscillator according to claim 1, wherein the second atmosphere is a vacuum.

9. The oscillator according to claim 1, wherein a pressure of the second atmosphere is equal to or greater than $1\times10^{-3}$ Pa and equal to or less than 10 Pa.

10. An oscillator comprising:
    a vibration element;
    an oscillation circuit configured to oscillate the vibration element and output an oscillation signal;
    a temperature sensor;
    a temperature compensation circuit configured to compensate for a frequency temperature characteristic of the vibration element based on an output signal of the temperature sensor;
    a first case enclosing the vibration element, the first case including a first lid and having a first atmosphere; and
    a second case enclosing the first case, the oscillation circuit, the temperature sensor, and the temperature compensation circuit, the second case including a second base and having a second atmosphere, the first atmosphere having a higher pressure than a pressure of the second atmosphere, the first lid being bonded to the second base.

11. The oscillator according to claim 10, wherein:
    the first case includes a first base, the first base including:
       a first surface, and
       a second surface on a side opposite to the first surface,
    the vibration element is disposed on the first surface, and
    the temperature sensor is disposed on the second surface.

12. The oscillator according to claim 11, further comprising:
    a terminal disposed on the second surface and electrically connected to the vibration element, and
    wherein the oscillation circuit is disposed on the second surface.

13. The oscillator according to claim 11, wherein the first lid is disposed on a side opposite to the first surface with respect to the vibration element.

14. The oscillator according to claim 13, wherein the first lid and the second base are bonded by an insulating adhesive.

15. The oscillator according to claim 10, wherein the first atmosphere includes helium.

16. The oscillator according to claim 10, wherein the second atmosphere is a vacuum.

17. The oscillator according to claim 10, wherein a pressure of the second atmosphere is equal to or greater than $1\times10^{-3}$ Pa and equal to or less than 10 Pa.

18. An oscillator system comprising:
    a first case including a first lid and having a first atmosphere and encasing a vibration element; and
    a second case including a second base and having a second atmosphere, the second base being affixed to the first lid, a pressure of the first atmosphere being different from a pressure of the second atmosphere, and the second case encasing:
       the first case;
       an oscillation circuit configured to oscillate the vibration element; and
       a temperature compensation circuit configured to compensate for a frequency temperature characteristic of the vibration element.

19. The oscillator system of claim 18, wherein:
    the first case includes:
       a first base affixed to the oscillation circuit and the temperature compensation circuit, and
    the second case includes a second lid.

20. The oscillator system of claim 18, wherein the pressure of the first atmosphere is higher than the pressure of the second atmosphere.

* * * * *